(12) United States Patent
Cyrusian

(10) Patent No.: US 6,690,209 B1
(45) Date of Patent: Feb. 10, 2004

(54) PHASE DETECTING WITH PARALLEL DISCHARGE PATHS

(75) Inventor: Sasan Cyrusian, Santa Cruz, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/675,998

(22) Filed: Sep. 28, 2000

(51) Int. Cl.[7] .............................................. G01R 25/00
(52) U.S. Cl. ............................................ 327/12; 327/3
(58) Field of Search ................................ 327/2, 3, 7, 8, 327/10, 12, 217, 216, 218, 149, 1

(56) References Cited

U.S. PATENT DOCUMENTS

| | | | |
|---|---|---|---|
| 4,291,274 A | * | 9/1981 | Suzuki et al. .................. 327/12 |
| 5,095,225 A | * | 3/1992 | Usui ........................... 327/217 |
| 5,661,419 A | | 8/1997 | Bhagwan ....................... 327/8 |
| 5,736,872 A | | 4/1998 | Sharma et al. .................. 327/3 |
| 5,815,041 A | | 9/1998 | Lee et al. ...................... 331/8 |
| 5,892,380 A | | 4/1999 | Quist .......................... 327/172 |
| 5,977,801 A | | 11/1999 | Boerstler ....................... 327/7 |
| 6,049,233 A | | 4/2000 | Shurboff ........................ 327/2 |
| 6,064,235 A | | 5/2000 | Hayashi et al. ................. 327/2 |
| 6,075,832 A | * | 6/2000 | Geannopolos et al. ........ 327/149 |
| 6,218,879 B1 | * | 4/2001 | Kilpatrick .................... 327/217 |

* cited by examiner

Primary Examiner—Timothy P. Callahan
Assistant Examiner—Linh Nguyen
(74) Attorney, Agent, or Firm—Fish & Richardson P.C.

(57) ABSTRACT

Improved systems and methods of phase detecting are described. In one aspect, a phase detector includes a latch having an input stage and an output stage. The input stage couples to the output stage through a dynamic storage node and includes a discharge circuit. The discharge circuit has a first input and a second input and defines a discharge path for discharging the dynamic storage node that is substantially symmetric with respect to the first and second inputs. In another aspect, the dynamic storage node is discharged with a characteristic discharge time in response to a transition of the first input from a low logic level to a high logic level when the second input is at a high logic level. The dynamic storage node also is discharged with substantially the same characteristic discharge time in response to a transition of the second input from a low logic level to a high logic level when the first input is at a high logic level.

23 Claims, 3 Drawing Sheets

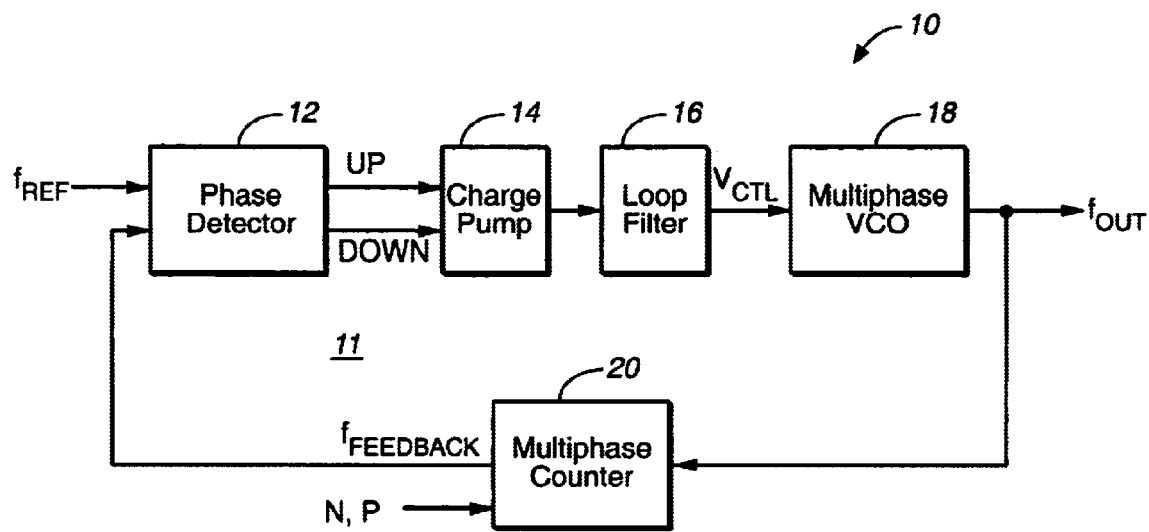
FIG._1
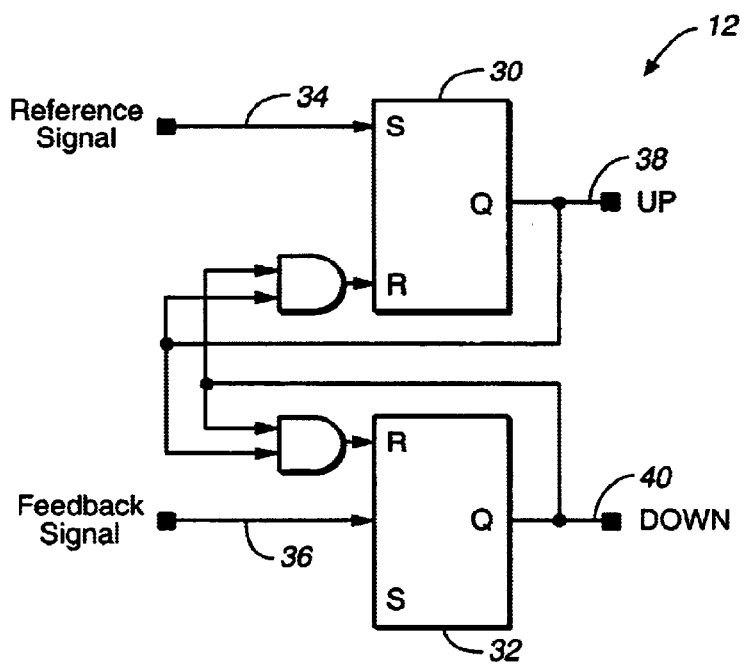
FIG._2

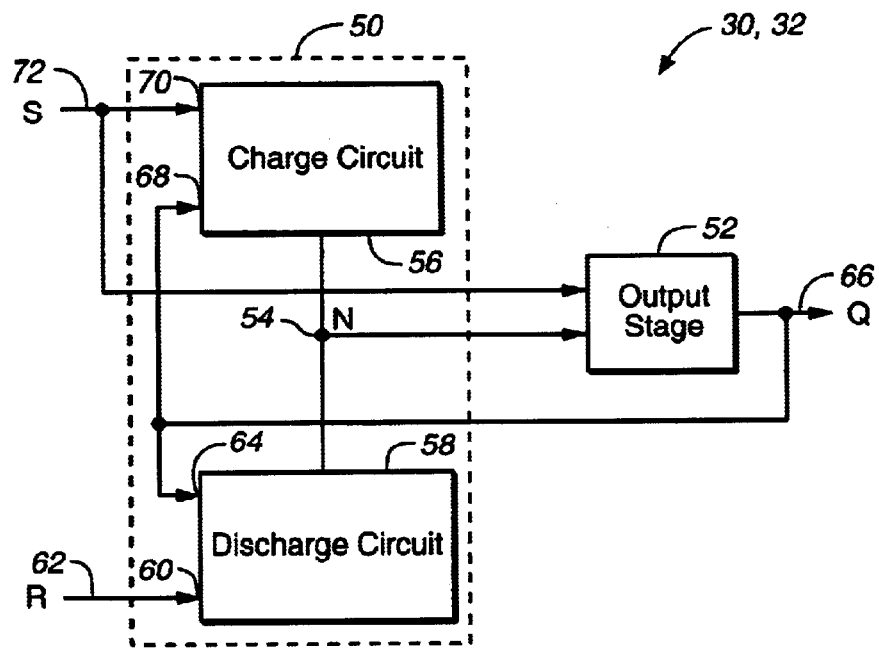
FIG._3
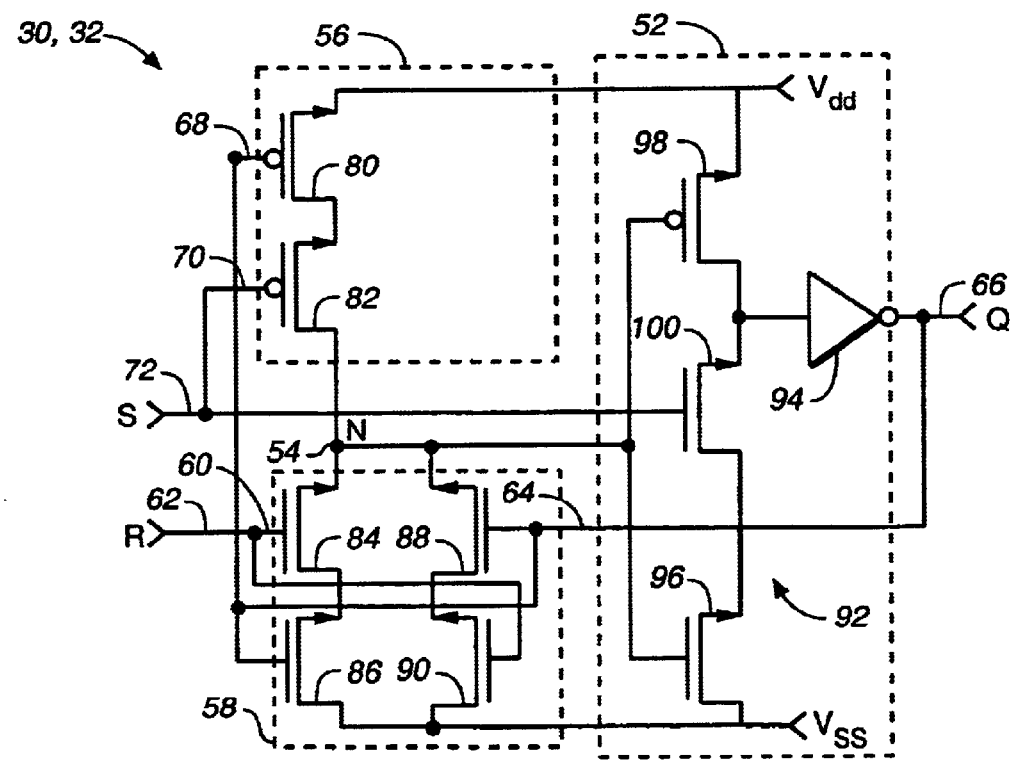
FIG._4

PHASE DETECTING WITH PARALLEL DISCHARGE PATHS

CROSS-REFERENCE TO RELATED APPLICATIONS

This application is related to U.S. application Ser. No. 09/676,277, May 17, 2001 filed on even date herewith, by Sasan Cyrusian, and entitled "High Resolution, Low Jitter Frequency Synthesizer," which is incorporated herein by reference.

TECHNICAL FIELD

This invention relates to systems and methods of phase detecting, including phase detectors, phase frequency detectors and methods of operating the same.

BACKGROUND

Phase detectors often are found in phase-locked loops, which may be used to generate clock signals in data communication systems, local area networks, microprocessors, and data storage applications (e.g., disk drives). A phase-locked loop typically includes a phase detector (or phase frequency detector), a charge pump, a low pass filter, a voltage-controlled oscillator (VCO), and a programmable divider. The frequency divider is located in the feedback path and tunes the VCO frequency ($f_{VCO}$) to a multiple of the reference frequency ($f_{REF}$). In one frequency synthesis approach, the frequency divider divides the VCO output signal frequency ($f_{VCO}$) by N to produce a feedback signal with a frequency $f_{VCO}/N$. The phase detector tunes the VCO until the phase of the feedback signal matches the phase of the reference signal. By changing the value of N, the output signal produced by the VCO may be changed in frequency steps that are equal to the reference frequency (i.e., $f_{VCO}= N \cdot f_{REF}$)

In this approach, the phase detector monitors the relative timing between the edges of the reference signal and the feedback signal and generates UP and DOWN output pulses depending on whether the transitions of the VCO output signal lead or lag the reference signal. The widths of these output pulses correspond with the times between the edges of the reference signal and the feedback signal. The UP and DOWN output pulses are applied to the input of the charge pump. The charge pump dynamically adjusts the charge supplied to the low pass filter. The resulting signal at the output of the low pass filter controls the frequency of the output signal generated by the VCO. Jitter (noise) generated by any of the components of the phase-locked loop, including the phase detector, directly produces jitter in the output VCO signal, reducing the performance of the frequency synthesizer.

SUMMARY

The invention features improved systems and methods of phase detecting with high frequency and low jitter.

In one aspect, the invention features a phase detector comprising a latch having an input stage and an output stage. The input stage couples to the output stage through a dynamic storage node and includes a discharge circuit. The discharge circuit has a first input and a second input and defines a discharge path for discharging the dynamic storage node that is substantially symmetric with respect to the first and second inputs.

Embodiments may include one or more of the following features.

The discharge path preferably is substantially symmetric with respect to transitions to a state in which the first and second inputs both are high. The discharge circuit may include first and second anti-symmetric discharge subpaths. The first discharge subpath preferably comprises a base gate having an input coupled to the first discharge circuit input and an intermediate gate coupled between the base gate and the dynamic storage node and having an input coupled to the second discharge circuit input. The second discharge subpath preferably comprises a base gate having an input coupled to the second discharge circuit input and an intermediate gate coupled between the base gate and the dynamic storage node and having an input coupled to the first discharge circuit input. In one embodiment, the gates of the first and second discharge subpaths include metal-oxide-semiconductor (MOS) transistors (e.g., n-type MOS (NMOS) transistors).

The phase detector preferably includes a charge circuit for charging the dynamic storage node. The charge circuit may have a first input coupled to the second discharge circuit input and a second input. The charge circuit preferably is configured to charge the dynamic storage node when the first and second charge circuit inputs both are low. The charge circuit may include a base gate having an input coupled to the first charge circuit input and an intermediate gate coupled between the base gate and the dynamic storage node and having an input coupled to the second charge circuit input. In one embodiment, the base and intermediate charge circuit gates include p-type metal-oxide-semiconductor (PMOS) transistors.

The output stage preferably is configured to transition the second discharge circuit input to the logic level of the dynamic storage node. The output stage preferably is configured to transition the second discharge circuit input to a high logic level of the dynamic storage node in response to a rising edge of a signal applied to the second charge circuit input.

The first discharge circuit input preferably is coupled to an output of a second latch and the second input is coupled to an output of the output stage.

In another aspect, the invention features a discharge circuit having a first input and a second input and defining a discharge path for discharging the dynamic storage node that has substantially the same propagation delays between the first and second inputs and the dynamic storage node.

In another aspect, the invention features a phase detecting method. In accordance with this inventive method, the dynamic storage node is discharged with a characteristic discharge time in response to a transition of the first input from a low logic level to a high logic level when the second input is at a high logic level. The dynamic storage node also is discharged with substantially the same characteristic discharge time in response to a transition of the second input from a low logic level to a high logic level when the first input is at a high logic level.

As used herein, the term "high" refers to a high logic level. Similarly, the term "low" refers to a low logic level.

Among the advantages of the invention are the following.

The invention provides a phase detector system characterized by a low delay and a short pulse width. Because the inventive discharge circuit defines a substantially symmetric discharge path, systematic state transition mismatches are substantially avoided. This feature substantially reduces jitter produced at the output of the phase detector. As a result, the inventive phase detector has a highly symmetrical output that may be advantageously used to improve the jitter performance and reference frequency feed through of charge pump-based phase-locked loops.

Other features and advantages of the invention will become apparent from the following description, including the drawings and the claims.

DESCRIPTION OF DRAWINGS

FIG. 1 is a block diagram of a frequency synthesizer, including a phase detector, a charge pump, a loop filter, a multiphase VCO and a multiphase counter.

FIG. 2 is a block diagram of a phase detector that includes a pair of cross-coupled latches.

FIG. 3 is a block diagram of one of the latches of FIG. 2.

FIG. 4 is a circuit diagram of the latch of FIG. 3.

DETAILED DESCRIPTION

Figure 5A:
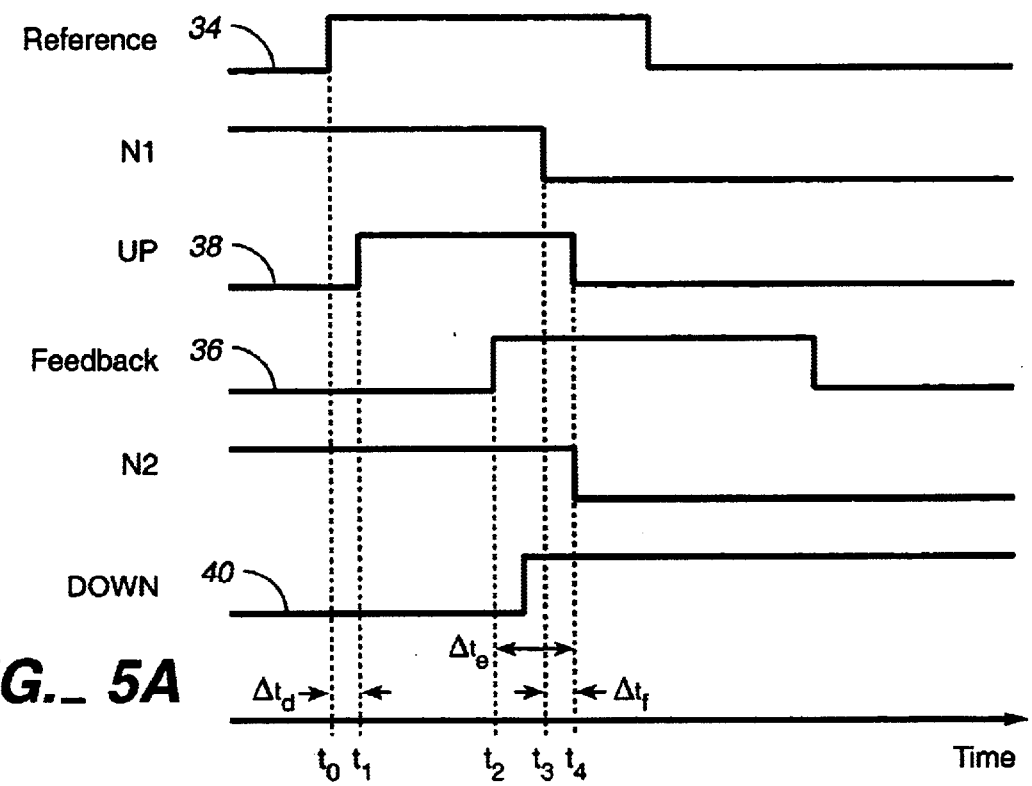
FIG. 5A is a time plot of node signals in the phase detector of FIG. 2 when the feedback signal lags the reference signal.

Referring to FIG. 1, in one embodiment, a frequency synthesizer 10 includes a phase-locked loop 11 with a phase detector 12, a charge pump 14, a loop filter 16, a multiphase voltage-controlled oscillator (VCO) 18, and a multiphase counter 20. In operation, phase detector 12 generates frequency adjustment signals UP and DOWN in response to a detected phase difference between a fixed-frequency reference signal (having a frequency $f_{REF}$) and a feedback signal (having a frequency $f_{FEEDBACK}$), which is produced at the output of multiphase counter 20. The reference signal may be generated by any stable frequency source (e.g., a crystal oscillator). In response to frequency adjustment signal UP, charge pump 14 charges a capacitor in loop filter 16 with a current $I_{PULL\ UP}$. In response to frequency adjustment signal DOWN, charge pump 14 discharges the loop filter capacitor with a current $I_{PULL\ DOWN}$ As explained in detail U.S. application Ser. No. 09/676,277, filed on Sep. 28, 2000, and incorporated herein by reference, the resulting voltage (VCTL) at the output of loop filter 16 controls the frequency ($f_{OUT}$) of the output signal generated by multiphase VCO 18. Multiphase counter 20 feeds a down-converted version of the output signal back to one of the inputs of phase detector 12. In particular, based on the programmable integer parameters N and P, multiphase counter generates from the output signal a down-converted feedback signal with a frequency ($f_{FEEDBACK}$) given by the following equation:

$$f_{FEEDBACK} = f_{OUT}/(N-P/x) \qquad (1)$$

where x is the number of phases of the output signal generated by multiphase VCO 18. By substituting $f_{REF}$ for $f_{FEEDBACK}$ and solving for $f_{OUT}$, the output signal frequency ($f_{OUT}$) may be expressed in terms of the reference frequency ($f_{REF}$) as follows:

$$f_{OUT} = f_{REF} \cdot (N-P/x) \qquad (2)$$

Thus, by proper selection of parameters N and P, a wide variety of output signal frequencies may be generated with a resolution of $f_{REF}/x$, a resolution that is x times greater than a conventional divide-by-N phase-locked loop frequency synthesizer.

As shown in FIG. 2, in one embodiment, phase detector 12 is implemented by a pair of cross-coupled RS latches 30, 32. Each RS latch operates with the following state transitions, which are responsive to the logic levels of signals applied to the inputs S and R. If the S (Set) input is high and the R (Reset) input is low, the output (Q) of the latch is pulled up to a high logic level. If the S input is low and the R input is high, Q is pulled down to a low logic level. If both R and S are high, Q will remain in the same state that it was in when only one of the inputs was high. As explained in detail below, in operation, latches 30, 32 switch states at the transition edges of a reference signal 34 and a feedback signal 36. A comparison of the outputs of latches 30, 32 determines both the width of the UP and DOWN pulses 38, 40 produced at the output of phase detector 12 and the phase relationship between reference signal 34 and feedback signal 36 (i.e., whether feedback signal 36 leads or lags reference signal 34). After the comparison of the latched output signals, latches 30, 32 are switched to a state that enables phase detector 12 to detect the next edge transitions of reference signal 34 and feedback signal 36.

As mentioned above, each latch 30, 32 features a substantially symmetric discharge path that substantially avoids any systematic state transition mismatches to provide a phase detector system characterized by a low delay and a short pulse width.

Referring to FIG. 3, each latch 30, 32 includes a cascaded set of dynamic logic blocks, including an input stage 50 and an output stage 52 that are coupled together through a dynamic storage node 54 (N). Input stage 50 includes a charge circuit 56 for charging dynamic storage node 54 and a discharge circuit 58 for discharging dynamic storage node 54. Discharge circuit 58 has a first input 60 coupled to a reset node 62 (R) and a second input 64 coupled to an output node 66 (Q). When both reset node 62 and output node 66 are high, discharge circuit 58 is configured to discharge dynamic storage node 54 through a discharge path that is substantially symmetric with respect to the first and second inputs 60, 64.

Charge circuit 56 has a first input 68 coupled to output node 66 and a second input 70 coupled to a set node 72 (S). When both output node 66 and set node 72 are low, charge circuit 56 is configured to charge dynamic storage node 54. Output stage 52 is configured to transition the charge state of dynamic storage node 54 to output node 66 on the rising edge of the set signal applied to set node 72.

Referring to FIG. 4, in one embodiment, each latch 30, 32 is implemented using metal-oxide-semiconductor (MOS) technology. In particular, charge circuit 56 includes a series connected pair of p-type MOS (PMOS) transistors 80, 82.

Discharge circuit 58 includes by an anti-symmetric pair of stacked n-type MOS (NMOS) transistors 84, 86, 88, 90 that define an anti-symmetric pair of discharge subpaths for discharging dynamic storage node 54. Output stage 52 includes a dual input buffer 92 and an inverter 94. Buffer 92 includes a pair of inverting NMOS and PMOS transistors 96, 98, which are coupled to dynamic storage node 54, and an NMOS input transistor 100, which is coupled to set node 72. In operation, if output node 66 is low, dynamic storage node 54 is pre-charged during the low phase of the set signal applied to set node 72. Input transistor 100 prevents output node 66 from switching states before the rising edge of the set signal (S). Discharge circuit 58 discharges dynamic storage node 54 when output node 66 and reset node 62 both are high. As explained in detail below, the rising edge of the output pulse produced at output node 66 (Q) is determined primarily by propagation delays through input transistor 100 and inverter 94, and the falling edge is determined primarily by propagation delays through discharge circuit 58.

Referring to FIGS. 2, 4 and 5A, when feedback signal 36 lags reference signal 34, the rising edge of a pulse of UP signal 38 is triggered by the rising edge of reference signal 34 and the falling edge of the UP signal pulse is triggered by the rising edge of feedback signal 36. Before time $t_0$, the respective dynamic storage nodes N1, N2 of latches 30, 32 are pre-charged to a high logic level by the respective charge circuits of latches 30, 32. At time $t_1$, the rising edge of reference signal 34 turns on input transistor 100 of latch 30, which pulls the input of inverter 94 of latch 30 to a low logic level and thereby drives the output of the inverter (i.e., UP signal 38) to a high logic level. At time $t_2$, the rising edge of feedback signal 36 transitions the high logic level of dynamic storage node N2 to DOWN signal 40, causing DOWN signal 40 to switch to a high logic level. The rising edge of DOWN signal 40 enables the discharge circuit of latch 30 to discharge dynamic storage node N1 at time $t_3$. The falling edge of dynamic storage node N1 causes transistor 98 of latch 30 to pull up the signal applied to the input of inverter 94 of latch 30, which pulls UP signal 38 to a low logic level at time $t_4$. Thus, the delay ($\Delta t_e$) between the rising edge of feedback signal 36 and the falling edge of UP signal 38 is determined, in part, by the discharge circuit of latch 30, which is enabled by the transition of DOWN signal 40 from the low state to the high state.

Figure 5B:
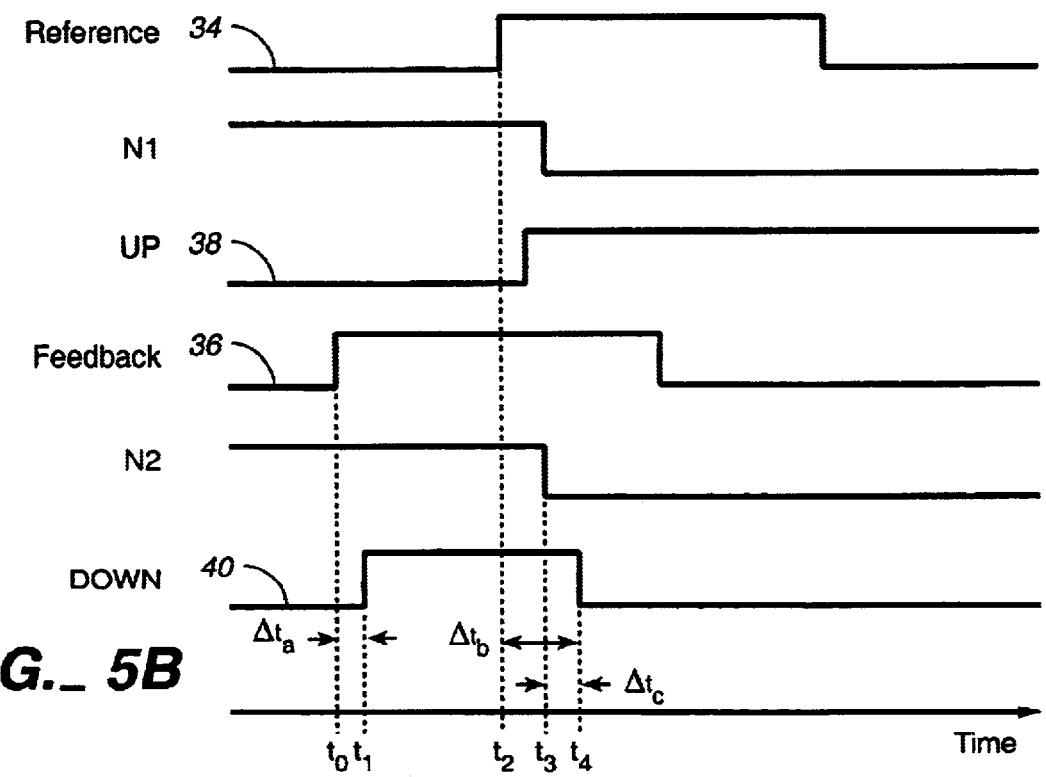
FIG. 5B is a time plot of node signals in the phase detector of FIG. 2 when the feedback signal leads the reference signal.

Referring to FIG. 5B, when feedback signal 36 leads reference signal 34, the rising edge of a pulse of DOWN signal 40 is triggered by the rising edge of feedback signal 36 and the falling edge of the DOWN signal pulse is triggered by the rising edge of reference signal 34. Before time $t_0$, the respective dynamic storage nodes N1, N2 of latches 30, 32 are pre-charged to a high logic level by the respective charge circuits of latches 30, 32. At time $t_1$, the rising edge of feedback signal 36 turns on input transistor 100 of latch 32, which pulls the input of inverter 94 of latch 32 to a low logic level and thereby drives the output of the inverter (i.e., DOWN signal 40) to a high logic level. At time $t_2$, the rising edge of reference signal 34 transitions the high logic level of dynamic storage node N1 to UP signal 38, causing UP signal 38 to switch to a high logic level. The rising edge of UP signal 38 enables the discharge circuit of latch 32 to discharge dynamic storage node N2 at time $t_3$. The falling edge of dynamic storage node N2 causes transistor 98 of latch 32 to pull up the signal applied to the input of inverter 94 of latch 32, which pulls DOWN signal 40 to a low logic level at time $t_4$. Thus, the delay ($\Delta t_b$) between the rising edge of reference signal 34 and the falling edge of DOWN signal 40 is determined, in part, by the discharge circuit of latch 32, which is enabled by the transition of UP signal 38 from the low state to the high state.

Assuming the transistors of latch 30 and latch 32 are matched, UP pulse 38 and DOWN pulse 40 will have substantially the same pulse widths for the same lead and lag times between feedback signal 36 and reference signal 34. This feature results from the fact that the propagation delay from the node of DOWN signal 40 to the dynamic storage node of latch 30 substantially matches the propagation delay from the node of UP signal 38 to the dynamic storage node of latch 32. In particular, the rise times ($\Delta t_a$ and $\Delta t_d$) are determined primarily by transistor delays through matched output stages. Similarly, the fall times ($\Delta t_b$ and $\Delta t_e$) are determined primarily by transistor delays through matched output stages (with delays of $\Delta t_c$ and $\Delta t_f$) and through discharge circuits that have substantially the same discharge times with respect to transitions of UP signal 38 from low to high and transitions of DOWN signal 40 from low to high.

Other embodiments are within the scope of the claims.

For example, although the above embodiments were described in connection with a pair of cross-coupled RS latches, other types of latches may be used, including D-latches and master-slave latches. Furthermore, other phase detector embodiments may include other types of latch configurations and may include additional latches or other circuit components.

What is claimed is:

1. A phase detector, comprising a latch having
   a dynamic storage node;
   an output stage including a plurality of transistors;
   an input stage coupled to the output stage through the dynamic storage node, the input stage comprising:
      a discharge circuit to discharge the dynamic storage node, the discharge circuit having a first discharge circuit input and a second discharge circuit input, the discharge circuit configured to discharge the dynamic storage node through a discharge path, the discharge path including a first discharge subpath and a second discharge subpath in parallel with the first discharge subpath, the first discharge subpath and second discharge subpath having substantially the same response to the first discharge circuit input and the second discharge circuit input.

2. The phase detector of claim 1, wherein the first discharge subpath comprises a base gate having an input coupled to the first discharge circuit input and an intermediate gate coupled between the base gate and the dynamic storage node and having an input coupled to the second discharge circuit input, and the second discharge subpath comprises a base gate having an input coupled to the second discharge circuit input and an intermediate gate coupled between the base gate and the dynamic storage node and having an input coupled to the first discharge circuit input.

3. The phase detector of claim 2, wherein the gates of the first and second discharge subpaths include metal-oxide-semiconductor (MOS) transistors.

4. The phase detector of claim 3, wherein the gates of the first and second discharge subpaths include n-type MOS (NMOS) transistors.

5. A phase detector comprising a latch having
   a dynamic storage node,
   an output stage including a plurality of transistors controlled by the dynamic storage node;
   an input stage coupled to the output stage through the dynamic storage node, wherein the input stage includes
      a charge circuit to charge the dynamic storage node, the charge circuit having a first charge circuit input and a second charge circuit input, and
      a discharge circuit to discharge the dynamic storage node, the discharge circuit having a first discharge circuit input, and a second discharge circuit input,
      wherein the first charge circuit input and the first discharge circuit input are an output of the output stage, and wherein the second charge circuit input and second discharge circuit input are separate inputs.

6. The phase detector of claim 5, wherein the charge circuit is configured to charge the dynamic storage node when the first and second charge circuit inputs both are low.

7. The phase detector of claim 5, wherein the charge circuit comprises a base gate having an input coupled to the first charge circuit input and an intermediate gate coupled between the base gate and the dynamic storage node and having an input coupled to the second charge circuit input.

8. The phase detector of claim 7, wherein the base and intermediate charge circuit gates include p-type metal-oxide-semiconductor (PMOS) transistors.

9. The phase detector of claim 5, wherein the output stage is configured to transition the first discharge circuit input to the logic level of the dynamic storage node.

10. The phase detector of claim 9, wherein the output stage is configured to transition the first discharge circuit input to a high logic level of the dynamic storage node in response to a rising edge of a signal applied to the second charge circuit input.

11. A phase detector comprising a latch having an input stage and an output stage, wherein the input stage is coupled to the output stage through a dynamic storage node and comprises a discharge circuit having a first discharge circuit input and a second discharge circuit input and defining a discharge path for discharging the dynamic storage node, wherein the first discharge circuit input is coupled to an output of a second latch and the second discharge circuit input is coupled to an output of the output stage.

12. A phase detector, comprising a latch having
   a dynamic storage node;
   an output stage including a plurality of transistors;
   an input stage coupled to the output stage through the dynamic storage node, the input stage comprising:
      a discharge circuit to discharge the dynamic storage node, the discharge circuit having a first input and a second input, the discharge circuit configured to discharge the dynamic storage node through a discharge path, the discharge path having substantially the same propagation delays between the first and second inputs and the dynamic storage node.

13. The phase detector of claim 12, wherein the discharge circuit comprises first and second parallel discharge subpaths.

14. The phase detector of claim 13, wherein the first discharge subpath comprises a base gate having an input coupled to the first discharge circuit input and an intermediate gate coupled between the base gate and the dynamic storage node and having an input coupled to the second discharge circuit input, and the second discharge subpath comprises a base gate having an input coupled to the second discharge circuit input and an intermediate gate coupled between the base gate and the dynamic storage node and having an input coupled to the first discharge circuit input.

15. The phase detector of claim 14, wherein the base and intermediate gate of the first discharge subpath and the base and intermediate gate of the second discharge subpath have substantially the same impedance.

16. The phase detector of claim 12, wherein the discharge circuit is configured to discharge the dynamic storage node when the first and second discharge circuit inputs both are high.

17. The phase detector of claim 12, further comprising a charge circuit with first and second charge circuit inputs and configured to charge the dynamic storage node when the first and second charge circuit inputs both are low.

18. The phase detector of claim 1, wherein the first and second discharge subpaths have substantially the same propagation delay.

19. The phase detector of claim 2, wherein the base and intermediate gate of the first discharge subpath and the base and intermediate gate of the second discharge subpath have substantially the same impedance.

20. A phase detector, comprising a latch having
   a dynamic storage node,
   an output stage including a plurality of transistors controlled by the dynamic storage node,
   an input stage coupled to the output stage through the dynamic storage node, wherein the input stage includes
      a charge circuit to charge the dynamic storage node, the charge circuit having a first charge circuit input and a second charge circuit input, the charge circuit configured to charge the dynamic storage node when the first and second charge circuit inputs both are low, and
      a discharge circuit to discharge the dynamic storage node, the discharge circuit having a first discharge circuit input, and a second discharge circuit input, the discharge circuit configured to discharge the dynamic storage node when the first and second discharge circuit inputs both are high,
   wherein the first charge circuit input and the first discharge circuit input are an output of the output stage, and wherein the second charge circuit input and second discharge circuit input are separate inputs.

21. A phase detector, comprising:
   a first latch having a dynamic storage node, an input stage and an output stage, wherein the input stage is coupled to the output stage through the dynamic storage node and comprises a discharge circuit having a first input and a second input and having a discharge path to discharge the dynamic storage node; and
   a second latch having a dynamic storage node, an input stage and an output stage, wherein the input stage is coupled to the output stage through the dynamic storage node and comprises a discharge circuit having a first input and a second input and having a discharge path to discharge the dynamic storage node;
   wherein the flat input of the first latch is coupled to an output of the output stage of the first latch and the second input of the first latch is coupled to an output of the output stage of the second latch.

22. The phase detector of claim 21, wherein the first input of the second latch is coupled to the output of output stage of the second latch and the second input of the second latch is coupled to the output of the output stage of the first latch.

23. The phase detector of claim 1, wherein the output stage includes a plurality of transistors controlled by the dynamic storage node.

* * * * *